(12) United States Patent
Weingarten et al.

(10) Patent No.: US 8,693,258 B2
(45) Date of Patent: Apr. 8, 2014

(54) OBTAINING SOFT INFORMATION USING A HARD INTERFACE

(75) Inventors: Hanan Weingarten, Herzelia (IL); Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 248 days.

(21) Appl. No.: 13/370,197

(22) Filed: Feb. 9, 2012

(65) Prior Publication Data

US 2012/0236638 A1 Sep. 20, 2012

Related U.S. Application Data

(60) Provisional application No. 61/453,869, filed on Mar. 17, 2011.

(51) Int. Cl.
*G11C 11/34* (2006.01)

(52) U.S. Cl.
USPC .................................. 365/185.2; 365/189.15

(58) Field of Classification Search
CPC .......................... G11C 2216/12; G11C 7/1051
USPC .......................................... 365/185.2, 189.15
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |

(Continued)

OTHER PUBLICATIONS

Search Report of PCT Patent Application WO 2009/118720 A3.

(Continued)

*Primary Examiner* — Son Dinh
*Assistant Examiner* — Nam Nguyen
(74) *Attorney, Agent, or Firm* — Dentons US LLP

(57) ABSTRACT

A flash memory controller, a computer readable medium and a method for generating reliability information using a hard information interface, the method may include performing multiple read attempts, while using the hard information interface, of a plurality of flash memory cells to provide multiple read results; wherein each flash memory cell is read by providing a reference voltage to the flash memory cell; wherein a same reference voltage is provided during the multiple read attempts; and generating, for each flash memory cell, reliability information based upon multiple read results of the flash memory cell.

32 Claims, 13 Drawing Sheets

(56) References Cited

U.S. PATENT DOCUMENTS

| | | |
|---|---|---|
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,619,922 B2 * | 11/2009 | Li et al. .................... 365/185.12 |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |

(56) References Cited

U.S. PATENT DOCUMENTS

| | | |
|---|---|---|
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

Performing multiple read attempts while using the hard information interface, of a plurality of flash memory cells to provide multiple read results. Each flash memory cell may be read by providing a reference voltage to the flash memory cell. 410

Performing different types of read attempts that differ from each other by bit significance. 411

Generating, for each flash memory cell, reliability information based upon multiple read results of the flash memory cell. 420

Instructing a flash memory device that includes the hard interface, to perform read attempts and receiving read results from the hard interface. 413

Generating, for each flash memory cell, reliability information based upon multiple read results of the flash memory cell. 420

Generating the reliability information of a flash memory cell based upon (a) a relationship between numbers of read result of different values of the flash memory cells, and (b) a first mapping between values of the relationship and reliability information values. 421

Selecting a value of information representative of a content of a flash memory cell based upon (a) the relationship between numbers of read result of different values of the flash memory cells, and (b) the first mapping between values of the relationship and values of information representative of the content of the flash memory cell. 422

Estimating, for each flash memory cell, a voltage difference between a threshold voltage of the flash memory cell and the reference voltage provided; and wherein the generating, for each flash memory cell, the reliability information may be responsive to the voltage difference of the flash memory cell. 423

Estimating of the voltage difference of each flash memory cell may be responsive to (a) relationship between numbers of read result of different values and (b) a second mapping between the relationship and the voltage difference. 424

Taking into account the state of the multiple flash memory cells. 425

Estimating of the voltage difference of each flash memory cell in response to read results obtained during all of the types of the read attempts. 426

Estimating, for each flash memory cell, a flipping supply voltage that causes a change in a value of a read result of the flash memory cell. 427

Calculating a supply voltage difference between the flipping supply voltage value and a reference value of the supply voltage, and estimating the voltage difference based upon the supply voltage difference and a third mapping between supply voltage difference values and voltage difference value. The reference value may be selected out of the different values of the supply voltage. 428

Finding, for each of the different values of the supply voltages, a number of flipping flash memory cells; and selecting a reference value of the supply voltage based upon the numbers of flipping flash memory cells. 429

Finding the reference voltage within a range of supply voltages that may exhibit a minimal change in a number of flipping flash memory cells. 430

Performing the multiple read attempts without being aware of exact values of read thresholds utilized to read the multiple flash memory cells. 431

Performing the multiple read attempts while being prevented from directly changing read thresholds utilized to read the multiple flash memory cells. 432

OBTAINING SOFT INFORMATION USING A HARD INTERFACE

RELATED APPLICATIONS

This application is a NONPROVISIONAL of, claims priority to and incorporates by reference U.S. provisional patent application No. 61/453,869, filing date Mar. 17, 2011.

FIELD OF THE INVENTION

The present invention relates to flash memory devices and, in particular, to systems and methods for generating reliability information using a hard information interface to provide multiple read results from multiple flash memory cells.

BACKGROUND

Nonvolatile flash memory devices store information in the form of charge in a flash cell. A flash cell includes a CMOS transistor with an additional floating metal gate between the substrate and the gate of the transistor. The charge is stored in the floating gate and is injected to the floating gate during an operation known as programming. The charge may be removed during an operation known as an erase operation. As the charge in the floating gate may vary contiguously, it is possible to store more than just one bit per flash transistor by using several charge levels to symbolize different sequences of bits.

FIG. 1A demonstrates a voltage level distribution for a 3 pbc (bits per cell) flash memory cell. The voltage level distribution includes eight lobes 101-108. Each lobe represents a 3-bit value. Each lobe defines a range of thresholds voltages. A threshold voltage that belongs to that range represents the 3-bit value. FIG. 1A illustrates non-overlapping lobes, however this is only schematic, and in practical cases the lobes may overlap. The reason for overlapping may be intentional for obtaining high programming speed, or due to the retention effect. For floating gate devices, an "old" page, may introduce greater overlap between lobes than a new page, since after many program/erase (P/E) cycles there is accumulated trap charge, which is de-trapped over time. After a long duration, every lobe may have a larger standard deviation (std) and may have a different mean location. These effects are also known as retention.

The 3 bit per cell includes a most significant bit MSB (denoted 11 in FIG. 1), a central significant bit CSB (denoted 12 in FIG. 1) and a least significant bit LSB (denoted 12 in FIG. 1). A physical page of flash memory module may store three logical pages. This physical page is programmed one logical page after the other.

The programming includes various types of programming such as MSB programming, CSB programming and LSB programming.

In MSB programming some of the cells are programmed to a single lobe and some are left in the erase state. At the end of the programming process only two lobes exists, the erase and the MSB lobes.

In CSB programming the erase lobe and the MSB lobe are each split into two lobes by further programming pulses, depending on the original state of each cell and the corresponding CSB bit. At the end of this step there are four lobes.

In LSB programming each of the four lobes is further split to create 8 lobes, overall.

The logical pages are read by applying various types of read operations such as MSB read (in which a MSB threshold 114 is used), CSB read (in which two CSB thresholds 112 and 116 are used) and LSB read (in which four LSB thresholds 111, 113, 115 and 117 are used).

Each read operation is applied by providing to the gate of a read cell a reference voltage that equals one of the thresholds.

MSB reading includes supplying to the gate of a read transistor a reference voltage that equals the MSB threshold.

CSB reading includes a first read operation in which the gate is provided with a reference voltage that equals CSB threshold 112 and a second read threshold in which a reference voltage that equals CSB threshold 116 is provided.

LSB reading includes four read operations in which reference voltages that equals each of LSB thresholds 111, 113, 115 and 117 are provided to the gate of the cell.

FIG. 1B demonstrates a voltage level distribution for a 2 pbc (bits per cell) flash memory cell. This voltage level distribution includes four lobes 201-203. Each lobe represents a 2-bit value. In this case there are only one MSB threshold 212 and two LSB thresholds 211 and 213.

As mentioned, the lobe distributions are not constant throughout the life of the flash and change with retention. With retention, the distributions become larger and shift towards the erase level. The higher the distributions are the larger the shift. This effectively shrinks the effective working window. Both the shrinkage of the window and the fattening of the distributions contribute to the increase in number of errors after performing a page read. FIG. 2 illustrates these effects—the upper part of FIG. 2 includes eight non-overlapping lobes 301-308 that are positioned within a first window, the lower part of FIG. 2 illustrates overlapping lobes 311-318 that are positioned within a smaller window—the highest lobe is closer to the lowest lobe.

These effects become significantly worse as the block P/E cycles increase and as the NAND Flash memory technology node shrink.

The implications of the retention effect is that using the same set of read-thresholds just following a programming operation and then following retention time may contribute to the number of read errors.

FIG. 3 shows a typical prior art NAND FLASH string 30 and the reading circuitry 31 associated with it. A string is duplicated many times (say 34560 times) in a block and includes several (say 32) flash memory cells. Each of the flash memory cells is associated with a different wordline which connects all of the corresponding cells in the other strings of the block.

When a block is chosen, each string is connected to a corresponding bit-line by turning on the Bit Line Select and the Ground Select transistors. When a read operation is performed, a sense amplifier is connected to the bit-line and after allowing some time (say 25 uS) for the bit-line voltage to settle, the result is stored by a latch.

In order to measure the charge in a certain flash memory cell within a string, all other cells are switched on by applying a high voltage on their gates (given by Vbias) and a reference voltage Vref is applied to the gate of the selected cell. If the cell is charged and Vref is not high enough, the gate will not allow current to flow and the sense-amplifier will output a "0". On the other hand, if the cell is not charge or Vref is high enough, current will flow and the sense-amplifier will output a "1".

The above sampling technique holds when a bit may be obtained only through a single comparison (one bit per cell). When more than a single threshold comparison is required, the above procedure may be performed for each threshold and the results may then be combined.

Alternatively, several sense-amplifiers may be used simultaneously, and the current measured can be compared against multiple current thresholds—that are expected to distinguish between the threshold lobes.

Today's Flash devices will typically use a constant set of reference voltages that will minimized the number of errors as measured just following the programming procedure. However, such a choice will usually have an increased number of errors following a retention effect due to the lobe shift and widening effect.

The decoding capability following retention may be improved significantly, if on top of obtaining hard logical information per cell ("0" or "1") we would also obtain some reliability information per each of these bits. The following invention presents methods for obtaining reliability information per bit using the same standard interface.

SUMMARY OF THE INVENTION

According to an embodiment of the invention a method may be provided for generating reliability information using a hard information interface, the method may include performing multiple read attempts, while using the hard information interface, of a plurality of flash memory cells to provide multiple read results; wherein each flash memory cell is read by providing a reference voltage to the flash memory cell; wherein a same reference voltage is provided during the multiple read attempts; and generating, for each flash memory cell, reliability information based upon multiple read results of the flash memory cell.

The method may include generating the reliability information of a flash memory cell based upon (a) a relationship between numbers of read result of different values of the flash memory cells, and (b) a first mapping between values of the relationship and reliability information values.

The generating of the reliability information may be responsive to a state of the multiple flash memory cells.

The method may include selecting a value of information representative of a content of a flash memory cell based upon (a) a relationship between numbers of read result of different values of the flash memory cells, and (b) a first mapping between values of the relationship and values of information representative of the content of the flash memory cell.

The method may include generating the reliability information of the flash memory cell based upon (a) the relationship between numbers of read result of different values of the flash memory cells, and (b) the first mapping between values of the relationship and reliability information values.

The method may include: estimating, for each flash memory cell, a voltage difference between a threshold voltage of the flash memory cell and the reference voltage provided; and wherein the generating, for each flash memory cell, the reliability information may be responsive to the voltage difference of the flash memory cell.

The method may include using same read parameters during the multiple read attempts.

The estimating of the voltage difference of each flash memory cell may be responsive to (a) relationship between numbers of read result of different values and (b) a second mapping between the relationship and the voltage difference.

The method may include estimating the second mapping based upon a state of the multiple flash memory cells.

The method may include estimating the second mapping based upon a wear level of the multiple flash memory cells.

The method may include estimating the second mapping based upon an evaluated retention of the multiple flash memory cells.

The method may include performing different types of read attempts that differ from each other by bit significance; wherein the estimating of the voltage difference of each flash memory cell may be responsive to read results obtained during all of the types of the read attempts.

The method may include generating reliability information that is a log likelihood ratio (LLR).

The method may include supplying a supply voltage of different values to the multiple flash memory cells during different read attempts.

The method may include estimating, for each flash memory cell, a flipping supply voltage that causes a change in a value of a read result of the flash memory cell.

The estimating of the voltage difference of a flash memory cell may include: calculating a supply voltage difference between the flipping supply voltage value and a reference value of the supply voltage; and estimating the voltage difference based upon the supply voltage difference and a third mapping between supply voltage difference values and voltage difference values.

The reference value is selected out of the different values of the supply voltage.

The method may include finding, for each of the different values of the supply voltages, a number of flipping flash memory cells; and selecting a reference value of the supply voltage based upon the numbers of flipping flash memory cells.

The method may include finding the reference voltage within a range of supply voltages that is exhibits a minimal change in a number of flipping flash memory cells.

The method may include performing the multiple read attempts without being aware of exact values of read thresholds utilized to read the multiple flash memory cells.

The method may include performing the multiple read attempts while being prevented from directly changing read thresholds utilized to read the multiple flash memory cells.

The method may include calculating a first mapping between values of the relationship and reliability information values by programming known information to a plurality of flash memory cells; reading the plurality of flash memory cells multiple times to provide test results and comparing the test results to the known information.

The method may include generating the reliability information of a flash memory cell based upon (a) a relationship between numbers of read result of different values of the flash memory cells, (b) and a mapping between the relationship and log likelihood ratio (LLR).

The method may include calculating the mapping between the relationship and the LLR by programming and reading known information.

The method may include selecting a value of information representative of a content of a flash memory cell based upon a relationship between numbers of read result of different values of the flash memory cells.

The method may include selecting a value of information representative of a content of a flash memory cell based upon (a) a ratio between numbers of read result of different values of the flash memory cells; and (b) mapping between values of the ratio and values of the information.

The method may include generating a value of information representative of a content of a flash memory cell by performing a logical operation on multiple read results of a same flash memory cell.

The method may include selecting a value of information representative of a certain bit of a content of a flash memory cell based upon a value of information representative of at least one more significant bit of the content of the flash memory cell.

The method may include: selecting a selected logical operation to be applied on multiple read results of a same flash memory cell; and applying the selected logical operation on the multiple read results to provide a value of information representative of the certain bit of the content of the flash memory cell; wherein the selecting of the selected logical operation may be responsive to the value of information representative of the at least one more significant bit of the content of the flash memory cell.

The method may include: selecting a selected operand out of a "larger than" operand and a "smaller than" operand; comparing between a ratio between numbers of read result of different values of the flash memory cells and a threshold using the selected operand to provide a value of information representative of a certain bit of a content of a flash memory cell; wherein the selecting may be responsive to the value of information representative of the at least one more significant bit of the content of the flash memory cell.

Further embodiments of the invention include a computer readable medium that is non-transitory and may store instructions for performing the above-described methods and any steps thereof, including any combinations of same. For example, the computer readable medium may store instructions for performing multiple read attempts while using the hard information interface, of a plurality of flash memory cells to provide multiple read results; wherein each flash memory cell is read by providing a reference voltage to the flash memory cell; wherein a same reference voltage is provided during the multiple read attempts; and generating, for each flash memory cell, reliability information based upon multiple read results of the flash memory cell.

Additional embodiments of the invention include a system arranged to execute any or all of the methods described above, including any stages—and any combinations of same. For example, the system may include a flash memory controller, may include: (a) an interface arranged to send read commands to a flash memory device and to receive from a hard interface of a flash memory device read results indicative of a content of multiple flash memory cells of the flash memory device; wherein each flash memory cell is read by providing a reference voltage to the flash memory cell; wherein a same reference voltage is provided during the multiple read attempts; and (b) a reliability module arranged to generate, for each flash memory cell, reliability information based upon multiple read results of the flash memory cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 4A illustrates a method according to an embodiment of the invention;

FIG. 4B illustrates a stage of the method of FIG. 4A according to various embodiments of the invention;

Figure 1A:
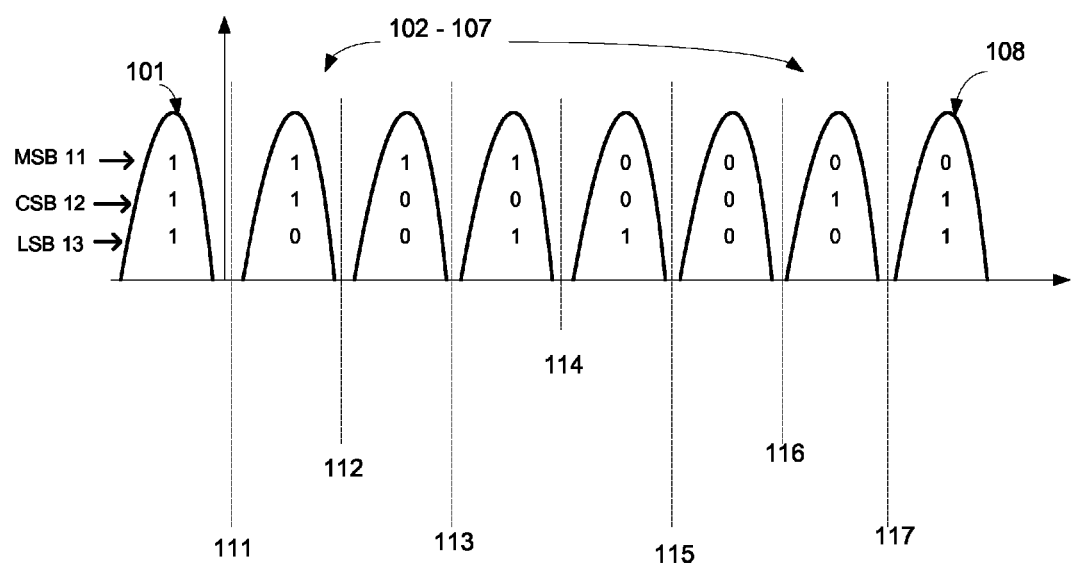
FIGS. 1A, 1B and 2 illustrate prior art threshold voltage distributions.
Figure 1B:
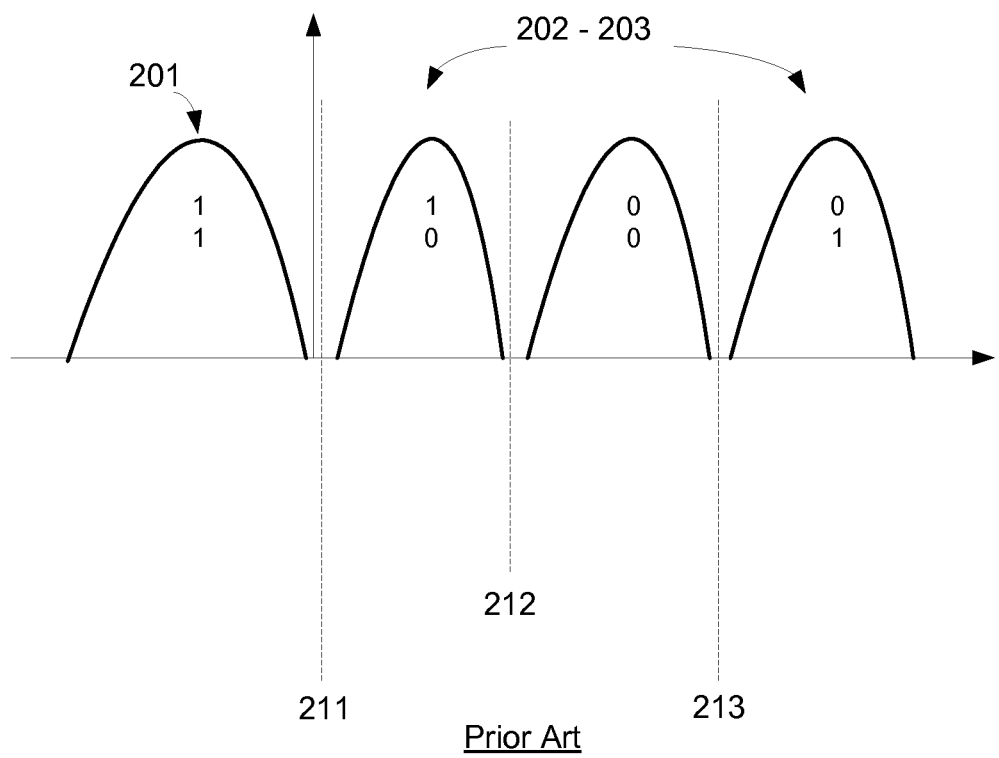

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

According to various embodiments of the invention soft information is provided even when using a hard interface. A hard interface allows to output only the read result—what was the estimated value stored in the flash memory cell. Soft information may also include reliability information of the hard information. The flash memory array that is connected to the hard interface can be read by using read thresholds that are unknown to the flash memory controller and additionally or alternatively can not be directly controlled by the flash memory controller.

FIG. 4A illustrates a method 400 for generating reliability information using a hard information interface, according to an embodiment of the invention.

Method 400 may start by stage 410 of performing multiple read attempts while using the hard information interface, of a plurality of flash memory cells to provide multiple read results. Each flash memory cell may be read by providing a reference voltage to the flash memory cell.

Stage 410 can be executed by a flash memory controller that is coupled to the flash memory device. Stage 410 may include stage 413 of instructing a flash memory device that includes the hard interface, to perform read attempts and receiving read results from the hard interface. Alternatively, stage 410 can be executed by a combination of the flash memory controller and the flash memory device.

Stage 410 may include performing read attempt that result in hard information that is outputted from the hard interface. The hard interface is not configured to output soft information. The hard interface itself can assist in concealing or preventing external control over read threshold, programming thresholds and the like.

Stage 410 may be followed by stage 420 of generating, for each flash memory cell, reliability information based upon multiple read results of the flash memory cell.

The reliability information can indicate the reliability of information that is outputted as reflecting the information stored in the multiple flash memory cells.

Figure 4C:
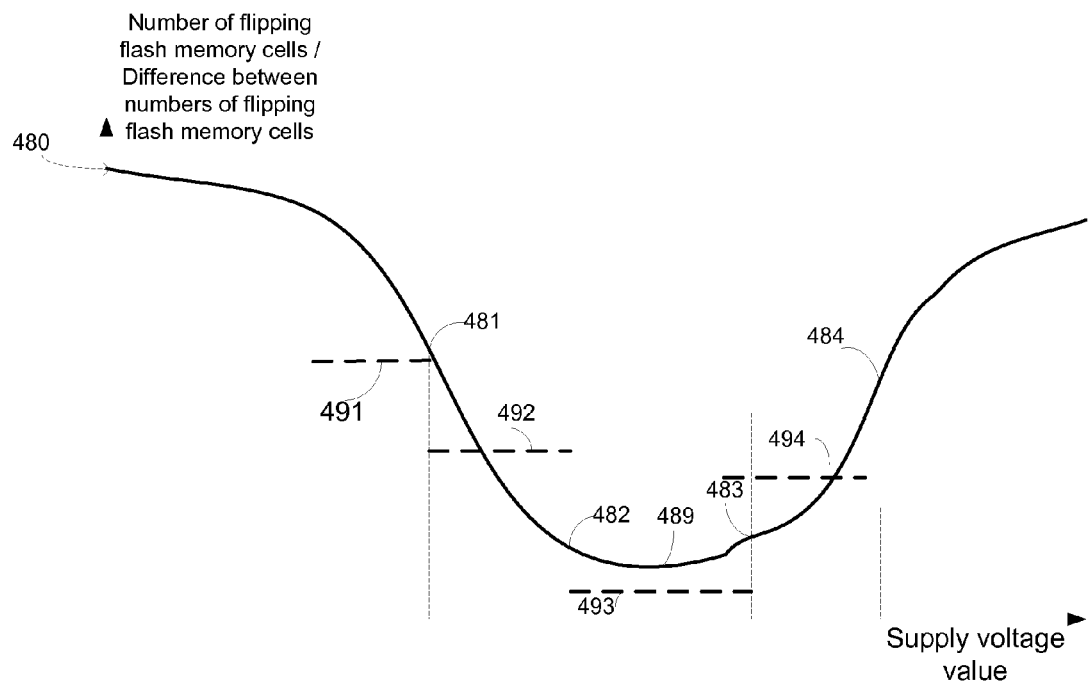
FIG. 4C illustrates an example of relationship between the number of flipping flash memory cells and a selected reference value of a supply voltage according to an embodiment of the invention.

Stage 420 may include one or more stages that are illustrated in FIG. 4C.

Stage 420 may include stage 421 of generating the reliability information of a flash memory cell based upon (a) a relationship between numbers of read result of different values of the flash memory cells, and (b) a first mapping between values of the relationship and reliability information values. This relationship and any mentioned below relationship can be a ratio or any other mathematical term.

The first mapping can differ than a second mapping or can be equal to the second mapping. The second mapping can represent a relationship between the relationship and a voltage difference between a threshold voltage of a flash memory cell and a reference voltage that is provided to the flash memory cell. Either one of the first and second mappings can be non-linear, have non-linear portions and additionally or alternatively have linear portions or be linear.

Figure 5A:
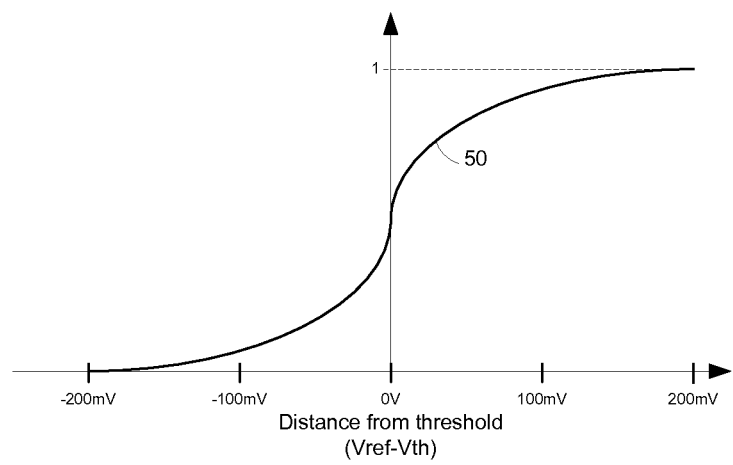
FIG. 5A illustrates the relationship between a voltage threshold, a reference voltage and a probability of reading a certain value of a flash memory cell that is provided with the reference voltage according to an embodiment of the invention.
Figure 5B:
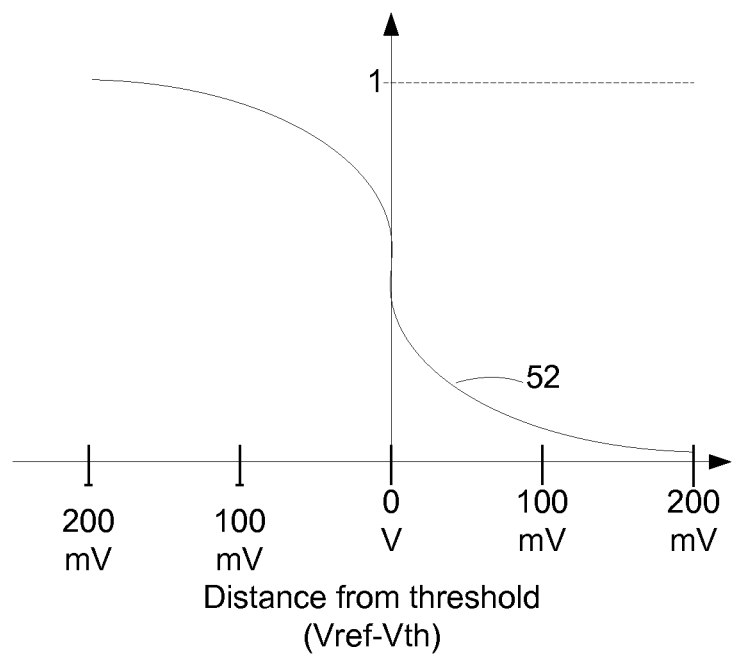
FIG. 5B illustrates the relationship between a voltage threshold, a reference voltage and a probability of reading a certain value of a flash memory cell that is provided with the reference voltage according to an embodiment of the invention.

A non-limiting example of the second mapping is illustrated in FIGS. 5A and 5B. The x-axis of these figures represents the voltage difference between a threshold voltage of a flash memory cell and a reference voltage that is provided to the flash memory cell. The x-axis can represent other entities such as reliability information values. The y-axis of these figures may represent the relationship (normalized between 1 and 0) between numbers of read results of different values. If the values are single bit values then the relationship can be the relationship between zero-valued read results and one-valued read results.

The soft information can include the reliability information and a value that is indicative of the content of a flash memory cell. This value has a reliability that is reflected by the reliability information.

Accordingly, stage 420 can include stage 422 of selecting a value of information representative of a content of a flash memory cell based upon (a) the relationship between numbers of read result of different values of the flash memory cells, and (b) the first mapping between values of the relationship and values of information representative of the content of the flash memory cell. The soft information in this case will include the information representative of the content of the flash memory cell (may be hard information) and its reliability—as reflected by the reliability information.

According to an embodiment of the invention the method can include estimating a voltage difference and then estimating the reliability information based upon the voltage difference. There may be a non-linear relationship between the voltage difference and the reliability information and it may be reflected by the second mapping.

Stage 420 may include stage 423 of estimating, for each flash memory cell, a voltage difference between a threshold voltage of the flash memory cell and the reference voltage provided; and wherein the generating, for each flash memory cell, the reliability information may be responsive to the voltage difference of the flash memory cell.

According to an embodiment of the invention stage 410 may include using the same read parameters during the multiple read attempts. These read parameters may include a value of a supply voltage, values of read thresholds, values of reference voltages and the like. It is noted that one or more read parameters can be altered while others can remain unchanged.

Stage 420 may include stage 424 of estimating of the voltage difference of each flash memory cell may be responsive to (a) relationship between numbers of read result of different values and (b) a second mapping between the relationship and the voltage difference.

According to an embodiment of the invention any mapping (for example—first, second ad third mappings) that is used during stage 420 can be affected by the state of the multiple flash memory cells.

The status can include program erase count, temperature, retention, wear level and the like.

Any mapping can be adjusted to a state (actual, estimated or evaluated) of the flash memory cells. The adjustment can be based upon information provided by a third party (such as a flash memory cell vendor), upon monitoring the state of the flash memory cell (for example keeping program erase counters, measuring the speed of programming (that increases with the wear level), and the like. The mapping can be represented by a parametric model and at least one of the parameters of the model can be responsive to the status of the multiple flash memory cells.

Additionally or alternatively, any mapping can remain unchanged while the estimation of the reliability information takes into account the state of the multiple flash memory cells.

Accordingly, stage 420 can include stage 425 of taking into account the state of the multiple flash memory cells. Stage 425 can include changing the first mapping, changing the second mapping, changing the relationship between the first or second mapping and the reliability information or a combination thereof.

Any of the methods mentioned in the specification can be applied to single level cells and to multi level cells. Multi level cells may be read by different types of reading (such as Most Significant Bit (MSB) reading, at least zero Central Significance Bit (CSB) reading and Least Significant Bit (LSB) reading).

Stage 420 can be responsive to read results obtained during different types of reading. Thus, stage 410 can include stage 411 of performing different types of read attempts that differ from each other by bit significance and stage 420 may include stage 426 of estimating of the voltage difference of each flash memory cell in response to read results obtained during all of the types of the read attempts.

The reliability information can have various forms. For example, it can include a log likelihood ratio (LLR).

According to an embodiment of the invention the different read attempts are executed while providing supply voltages of different values. This difference is expected to induce a change in the threshold voltages of the flash memory cells and thus may cause flash memory cells to flip-change their conductivity—and to provide read results of different values. The method may include tracking after the changes in the read results that result from the change in the supply voltages and to provide soft information in response to these changes. The method may also include finding a reference value of the supply voltage that should be provided to the multiple flash memory cells so as to achieve a certain goal—such as to prove more reliable read results. In a nut shell, the reference value of the supply voltage can belong to a range of values that exhibits a smallest amount of change in the number of flash memory cells that changed their values.

Figure 2:
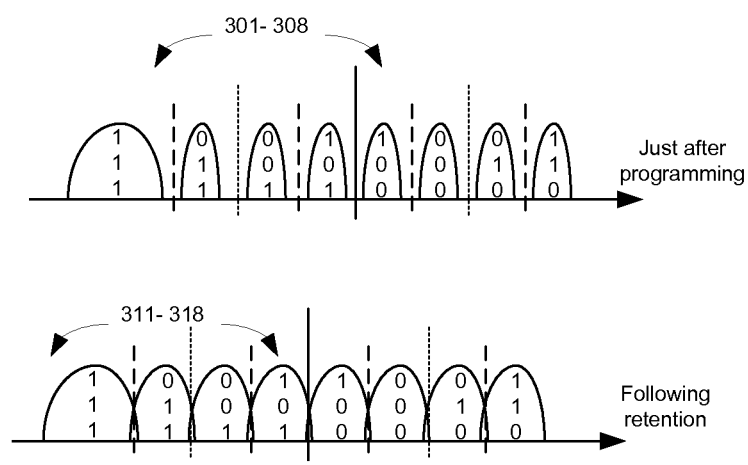
Figure 3:
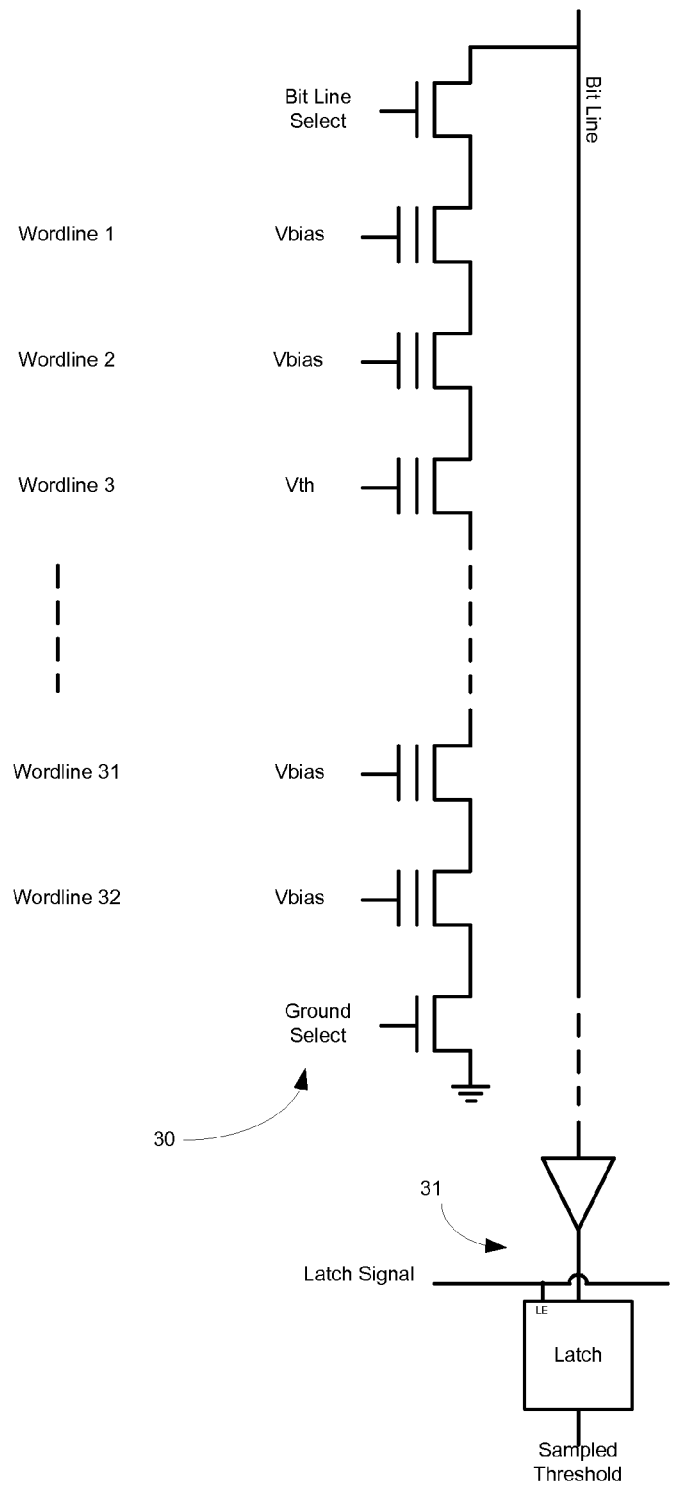
FIG. 3 illustrates a prior art NAND flash string and the reading circuitry associated with it.

In any type of reading that differs from MSB the read results of more significant bits should be taken into account in order to associate between flipping of flash memory cells and values involved in the flipping. Referring, for example, to FIG. 2 that represents eight lobes 301-308. If a CSB read attempt is made there is no way to know whether an increase in the number of "1" read results can be contributed to a flipping of flash memory cells from lobe 303 to lobe 302, to a flipping of flash memory cells from lobe 306 to lobe 307 or both. A MSB read attempt should be done in order to provide such information.

Accordingly, stage 410 may include stage 412 of supplying a supply voltage of different values to the multiple flash memory cells during different read attempts and stage 420 may include either one of stages 427, 428, 429 and 430 or a combination thereof. It is noted that some read attempts may be executed while receiving the same value of supply voltage (for example—read attempts that differ from each other by type-bit their bit significance).

Stage 427 may include estimating, for each flash memory cell, a flipping supply voltage that causes a change in a value of a read result of the flash memory cell.

Stage 427 may include stage 428 of calculating a supply voltage difference between the flipping supply voltage value and a reference value of the supply voltage, and estimating the voltage difference based upon the supply voltage difference and a third mapping between supply voltage difference values and voltage difference value. The reference value may be selected out of the different values of the supply voltage. The third mapping can be provided by the manufacturer of the flash memory array or can be learnt. The learning process may include programming known information to the multiple flash memory cells and reading the flash memory cells multiple times while changing the value of the supply voltage.

Stage 429 may include finding, for each of the different values of the supply voltages, a number of flipping flash memory cells; and selecting a reference value of the supply voltage based upon the numbers of flipping flash memory cells.

FIG. 4C illustrates an example of relationship between the number of flipping flash memory cells and a selected reference value of a supply voltage according to an embodiment of the invention. Curve 480 illustrates a relationship between values of a supply voltage provided to multiple flash memory cells and numbers of flipping flash memory cells.

Curve 480 is calculated by extrapolating discrete points 481-485, each representative of a value of a supply voltage and the number of flipping flash memory cells detected.

Curve 480 has a minimum 489 at a point that is located between a supply voltage range that is defined by two supply voltage values 482 and 483. The reference supply voltage can be selected out of that supply voltage range. It can be selected to match the minimum point 489 or be proximate to the minimum point.

The supply voltage range between points 482 and 483 exhibits a minimum amount of change in the number of flipping memory cells between its edges 482 and 483 (in comparison to other ranges of supply voltage values).

Curve 490 of FIG. 4B represents the change in the number of flipping flash memory cells between discrete points 481-484. Steps 491-494 of curve 490 illustrate the changes between the supply voltage represents by points 481-484 and preceding supply voltages.

Stage 430 may include of finding the reference voltage within a range of supply voltages that may exhibit a minimal change in a number of flipping flash memory cells.

Stage 420 may include stage 431 of performing the multiple read attempts without being aware of exact values of read thresholds utilized to read the multiple flash memory cells.

Stage 420 may include stage 432 of performing the multiple read attempts while being prevented from directly changing read thresholds utilized to read the multiple flash memory cells.

Multiple Read Attempts Using the Same Read Parameters

Typically, a flash memory cell starts conducting only when the reference voltage provided at its gate reaches the threshold voltage (Vth) of that flash memory cell.

The threshold voltage (Vth) of each flash memory cell may be determined by the amount of charge stored in that flash memory cell. Consecutive read attempts typically lead to the same read results. However, flash cells having a threshold voltage (Vth) that is close to the reference voltage (Vref) may exhibit modified outputs between one read operation and the next.

In a nut-shell—there is a non-linear relationship between the voltage difference (dv) between Vth and Vref (dv=Vth−Vref) and the reliability of a flash memory cell read operation. Higher absolute values of the voltage difference tend to be more reliable than lower absolute values of the voltage difference.

FIG. 5A includes a curve 50 that illustrates a symmetrical and non-linear relationship (a second mapping) between dv and the probability to read "1" from a flash memory cell that was programmed to store "1". If, for example, Vth=Vref then there is a 50% probability to read "1" and about 50% probability to read "0". If, for example, Vref exceeds Vth by at least 200 mVolts then there is about 100% to read "1". If, for example, Vref is lower from Vth by at least 200 mVolts then there is about 100% to read "0".

FIG. 5B includes a curve 52 that illustrates a symmetrical and non-linear relationship (Second mapping) between dv and the probability to read "1" from a flash memory cell that was programmed to store "0". Once again—the reliability increases in a non-linear manner as the absolute value of dv increases.

It is noted that the relationship may change from die to die and also over time—but can be measured, provided by the manufacturer or otherwise estimated or calculated.

The distance of the actual threshold of a flash memory cell from a reference voltage can be regarded as soft information or can be processed to provide soft information such as reliability information.

In order to obtain this information the flash memory cell is re-read multiple times and the results (either "0" or "1") are processed to determine the distance dv between the reference voltage (Vref) and Vth of that flash memory cell. Especially—the relationship between the times that "1" and "0" are read provides a probability value—this probability value corresponds to a point on the curve 50. This point provides "soft" information about the reliability of that read—and on the difference between Vref supplied to that flash memory cell (Vref is known) and the real Vth of that cell.

Thus, by performing several read attempts (each may include reading a page or another portion of a flash memory module) and counting the number '1's read at each flash memory cell, it is possible to figure out the voltage distance (dv) of the cell's threshold (Vth) from the reference voltage (Vref) supplied during the read attempt. This can be done by comparing the relationship of the number of '1' divided by the number of page reads to the probabilities represented by curve 50.

For example, if following ten read operations, we have counted only a single '1', we will deduce that the distance from the reference voltage is ~−100 mV. Alternatively, if nine of the read operations returned with '1' for the same cell, we shall deduce that that cell's threshold voltage is ~100 mv from the reference voltage.

This information may then be used to obtain reliability information per bit for the purpose of soft decoding. According to an embodiment of the invention the approximation of the voltage distance (dv) between the threshold voltage of each cell and Vref and information about the threshold voltage distribution of the flash memory cells can be processed to calculate a log likelihood ratio (LLR) per flash memory cell.

LLR is defined as $\log(P(Y|X=0)/P(Y|X=1))$ and is typically associated with a soft score, where Y is the distance a of a threshold voltage of a flash memory cell and a read threshold (corresponds to Vref). $P(Y|X=0)$ is the probability of detecting a charge at point Y given that the symbol transmitted agrees with the hard decision, and $P(Y|X=1)$ is the probability of detecting a charge at point Y given that the symbol transmitted disagrees with the hard decision In mathematical terms: $LR=P(Y/X=1)/P(Y|X=0)$.

The threshold voltage distribution may provide the LLR as a function of Y. Especially—each threshold voltage value (Y) may be associated with such a log likelihood ratio.

The multiple read values provide Y and allow us to calculate the ratio $P(Y|X=1)/P(Y|X=0)$.

It is noted that the threshold voltage distribution can change over time (as a function of the state of the multiple flash memory cells) and that the multiple measurements of threshold voltages (or estimations based on Vref and dv) can be used to indicate the actual threshold voltage distribution. If, for example, the threshold voltage distribution may belong to some parametric family of distributions, then dv and Vref can be used to evaluate those parameters. The parameters may change depending on the cycle count, retention and a given Flash device.

According to an embodiment of the invention the results of the multiple read attempts may be used to obtain a more coarse estimation such as determining which of flash memory cells should be deemed reliable and which are not reliable. These flash memory cells may differ from each other by the relationship between "0" and "1" read results. Such flash memory bits can be amended or be regarded as erased bits. An error correction code can rectify more erased bits that erroneous bits. Thus, classifying such flash memory cells as erased can allow the same error correction code to remedy more bits.

Figure 6:
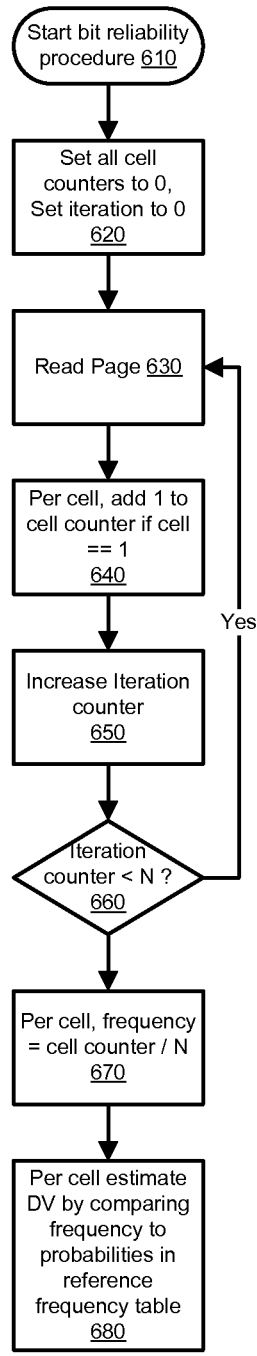
FIG. 6 illustrates a method for reading flash memory cells according to an embodiment of the invention.

FIG. 6 illustrates method 600 for reading flash memory cells according to an embodiment of the invention. Method illustrates a reading of an MSB page.

Method 600 starts by a sequence of stages 610, 620, 630, 640, 650 and 660.

Stage 610 includes starting a bit reliability procedure.

Stage 620 includes setting each flash memory cell counters to zero and setting an iteration counter to zero. Each flash memory cell has its own counter.

Stage 630 includes reading a flash memory page by supplying Vref to each flash memory cell that is being read.

Stage 640 includes increasing a flash memory cell counter of each flash memory cell that was read as "1".

Stage 650 includes increasing the iteration counter.

Stage 660 includes checking if the desired number of iterations (N) was reached. If not—stage 660 is followed by stage 630. If so—stage 660 is followed by stage 670 of calculating, per flash memory cell a frequency value which is the ratio between the flash memory cell counter and the number of iterations (N).

Stage 670 is followed by stage 680 of estimating dv (Vref−Vth)—based on the frequency value and an expected mapping between the frequency value and dv.

Supply Voltage (VDD) Modifications

According to an embodiment of the invention flash memory cells can be re-read while changing their supply voltage (VDD) between one read attempt to the other while reading Vref unchanged. The threshold voltage of a flash memory cell is responsive to the value of VDD. The VDD can be changed in order to find a value of VDD (referred to as flipping voltage) that will cause the read result of a flash memory cell to change from "0" to "1" (or vice versa). The flash memory cells that flipped due to the change have a threshold voltage that is near Vref.

For example, a NAND flash memory cell may be expected to function with VDD values ranging between 2.7V and 3.6V. However, changing the value of VDD between 2.7V and 3.6V may cause the threshold voltage to shift by 100 mV and multiple read operations can result obtaining "soft" information per cell around the reference voltages.

In addition, a mapping between VDD values and Vth values can be obtained by programming known data to flash memory cells and performing multiple read iterations at different Vdd values.

Figure 7:
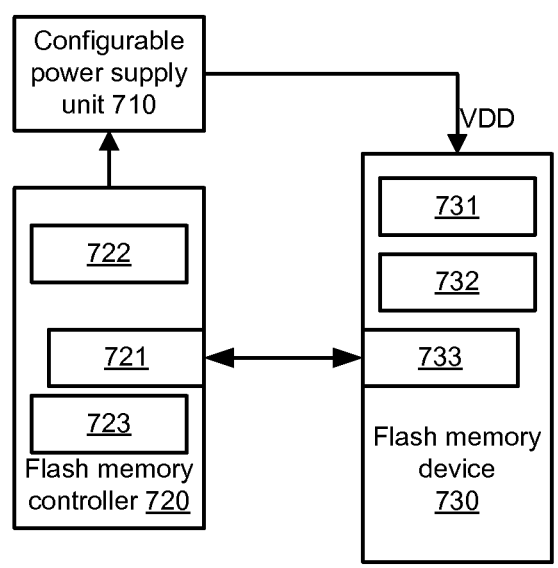
FIG. 7 illustrates a system according to an embodiment of the invention.

FIG. 7 illustrates a system 700 according to an embodiment of the invention.

System 700 includes a flash memory device 730. The flash memory device 730 has one or more a flash memory arrays 731, each including a plurality of flash memory cells, an internal controller 732 and a hard interface 733. The internal controller can control the read, write and programming operations. The flash memory device 730 can receive a supply voltage VDD from a power supply unit such as configurable power supply unit 710. The configurable power supply unit 710 can be controlled by a flash memory controller (may be referred to as microcontroller) that can be external to the flash memory device 730. The flash memory controller 720 may not be able to directly change the read parameters applied by the internal controller 731 and can be prevented from knowing these read parameters but can issue read commands and receive hard information from the hard interface 733.

The flash memory controller 720 can include (a) an interface 721 arranged to send read commands to a flash memory device and to receive (from a hard interface 733) of the flash memory device 730 read results indicative of a content of multiple flash memory cells of the flash memory device; wherein each flash memory cell is read by providing a reference voltage to the flash memory cell; and (b) a reliability module 722 arranged to generate, for each flash memory cell, reliability information based upon multiple read results of the flash memory cell. The flash memory controller 720 can also include a control module 723 arranged to determine when to send commands such as read commands and when (and how) to ask the configurable power supply unit 710 to change the supply voltage is provided to the flash memory device 730.

Retention Shift Recovery with Page Re-Reads

According to an embodiment of the invention the effect of retention is taken into account when processing multiple read operations. The retention is expected to cause the voltage threshold lobes to move to the left—towards lower values. Thus, the ratio of "1" read results to "0" read results of the same flash memory cell that will mandate associating a certain value with that flash memory cell may change over time to compensate for the retention.

For example, assuming that an MSB page is read within a single MSB threshold (Vref=MSB threshold). All flash memory cells with threshold voltages above that MSB threshold are read as "0" and all flash memory cells with threshold voltage below that MSB threshold will be read as "1". Following retention, the threshold voltage distribution shift toward to the left (towards lower threshold voltage values) and therefore, multiple read attempts will yield in more '0's than before. These changes (in the read results) will typically affect those flash memory cells having threshold voltages that were closer to the reference voltage prior to retention.

If, for example, a flash memory cell has been read several times and part of the time it has been read as '0' and part of it as '1', the flash memory cell can be regarded as storing '0'. The reason is that this flash memory cell may have began its life having a threshold voltage that is above the reference voltage Vref and its threshold voltage may have shifted below Vref due to retention. Note that cells that began their life having a threshold voltage that is lower than the Vref will probably end up much lower due to retention.

Therefore, a flash memory cell can be read N times. If the number of times the flash memory cell was read as '0' was equal or larger than K (K may be smaller than N/2), then the flash memory cell will be designated as storing "0". Otherwise it is designated as '1'. The values of K and N may be modified to optimize reliability.

It is noted that MSB read operations depend only upon themselves while CSB and LSB read operations also depend on the values obtained during coarser read operations.

For example, LSB pages in 2 bpc devices may also be detected using a similar method. However, in LSB pages the detection rule per cell will depend on the underlining MSB page.

Thus, flash memory cells may be read (multiple times) by applying an MSB read operation and the results per flash memory cell are stored. This is followed by performing multiple read operation per cell using LSB thresholds. If, for a certain flash memory cell, the corresponding MSB bit is 1 and the number of times a flash memory cell was read as '0' was equal or larger than K<N/2, then the flash memory cell will be designated as 0. If the corresponding MSB bit is 0 and the number of times a flash memory cell was read as '1' was less than K (K may be smaller than N/2), then the cell will be designated as 0. For all other cases, the cell will be designated '1'. A different value of K can be optimized to each threshold level.

Figure 8:
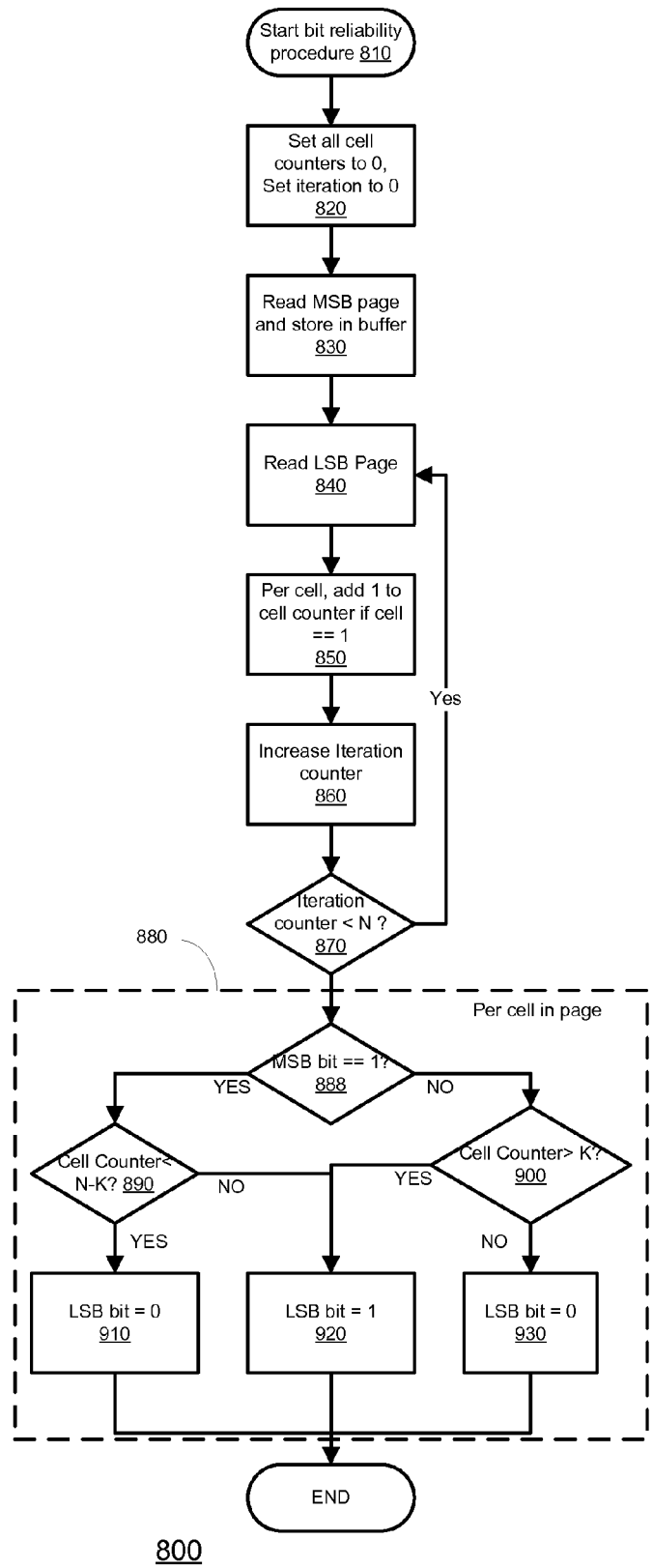
FIG. 8 illustrates a method for reading flash memory cells according to an embodiment of the invention.

FIG. 8 illustrates method 800 for reading flash memory cells according to an embodiment of the invention. Method illustrates a reading of an LSB page of two bits per cells (2 pbc)—thus there are two types of read operations—an MSB read and a LSB read type.

Method 800 starts by a sequence of stages 810, 820, 830, 840, 850, 860, 870 and 880.

Stage 810 includes starting a bit reliability procedure.

Stage 820 includes setting each flash memory cell counters to zero and setting an iteration counter to zero. Each flash memory cell has its own counter.

Stage 830 includes reading a MSB flash memory page and storing the result in the memory.

Stage 840 includes reading a LSB flash memory page and this may include supplying Vref to each flash memory cell that is being read.

Stage 850 includes increasing a flash memory cell counter of each flash memory cell that was read as "1".

Stage 860 includes increasing the iteration counter.

Stage 870 includes checking if the desired number of iterations (N) was reached. If it is determined that N was not reached then stage 870 is followed by stage 840. If it is determined that N was reached then stage 870 is followed by stage 888 of checking the LSB bit of the flash memory cell, per each flash memory cell Stage 880 starts by query stage 882 of checking if the MSB value (associated with the flash memory cell) equals 0 or 1.

If it is determined that the MSB equals zero then stage 882 is followed by stage 890 of evaluating whether the flash memory cell counter exceeds the difference between N and K. If is determined that the flash memory cell counter exceeds (N−K) then stage 890 is followed by stage 910 of determining that the LSB bit of the flash memory cell is zero.

If is determined that the flash memory cell counter does not exceed (N−K) then stage 890 is followed by stage 920 of determining that the LSB bit of the flash memory cell is one.

If it is determined that the MSB equals one then stage 882 is followed by stage 900 of evaluating whether the flash memory cell counter exceeds K. If is determined that the flash memory cell counter exceeds K then stage 900 is followed by stage 920 of determining that the LSB bit of the flash memory cell is one.

If is determined that the flash memory cell counter does not exceed K then stage 900 is followed by stage 930 of determining that the LSB bit of the flash memory cell is zero.

It is noted that for the case of K=0, we can replace the counter operation of stage 850 and the comparison stages 890 and 900 with an AND operation for LSB bits with corresponding MSB bits=1 and an OR operation for LSB bits with corresponding MSB bits=0.

Obtaining Soft Information using Known Reference Information

According to an embodiment of the invention soft information can be obtained by reading known reference information—even without using threshold voltage distribution models.

The method may start by programming known reference information. A page (or other memory space) can be programmed with the known reference information and can be read multiple times—at different points of time during the lifespan of the flash memory unit.

Log likelihood ratio can be calculated based on the read results—as discussed above.

More specifically, a reference flash memory block is chosen which is programmed with known reference information. In order to evaluate multiple cell values the known reference information can be evenly spread over all possible cell values.

If, for example, a sequence of N MSB read operation is performed then the log likelihood ratio can be computed by applying a logarithmic operation (LOG) on the ratio between (number of cells with MSB value='1' and given frequency)/(number of cells with MSB value='0' and given frequency). The frequency of a flash memory cells equals the number that flash memory cell was read as equaled "1"/N.

It is noted that the read results may be affected by retention and thus may change over time. According to an embodiment of the invention the sequence of N read operations may be repeated for several scenarios (over different program erase cycle counts and at different points in time) and to construct a parametric model which depends on the cycle count and the retention the block has underwent. For example, the probability distributions illustrated in FIGS. 5A and 5B can change over time and, additionally or alternatively, change as a result of program erase cycles. For example—the mapping can be shifted to the left as a result of retention (discharging of flash memory cells). Yet for another example these mapping can expand, rotate or undergo any other transformation. These probability distributions can be learnt from performing learning session that may include writing known information to flash memory cells, scanning threshold voltages of the flash memory cells and performing multiple read operations. The repetition of such learning sessions at different times and different program erase cycles can be provide a mapping between the results of read operations (frequency—ratio between "0" and "1" read results) and the stage (program erase cycle, time) of flash memory cells. The mapping can be used to evaluate a state of a certain flash memory array that is re-read multiple times and is associated with certain program erase count values.

Alternatively, the parametric model may depend on some statistical properties that were obtained from the read operation. For example, the number of cells with a given range of frequencies.

According to an embodiment the parametric model may indicate the relationships between re-read results (frequencies—ratios between "0" and "1" read results) and a state of a flash memory cell. The parametric model may be built by programming known values to flash memory cells and re-reading these flash memory cells at different conditions (program and erase cycles, time) and providing a mapping between initial values ("0" or "1"), frequencies and state of the flash memory cell (program erase cycles, time). Thus one or multiple graphs (or other mathematical representations) can be provided in which one axis is the likelihood ratio (frequency) and another axis represents the number of flash memory cells that were programmed to a certain value and exhibit that frequency.

In case we wish to build a LR model for an LSB page in a 2 bpc device, the model should be constructed per threshold and the test should first include reading an MSB page in order to distinguish between the thresholds (as was done in the subsection above).

Figure 9:
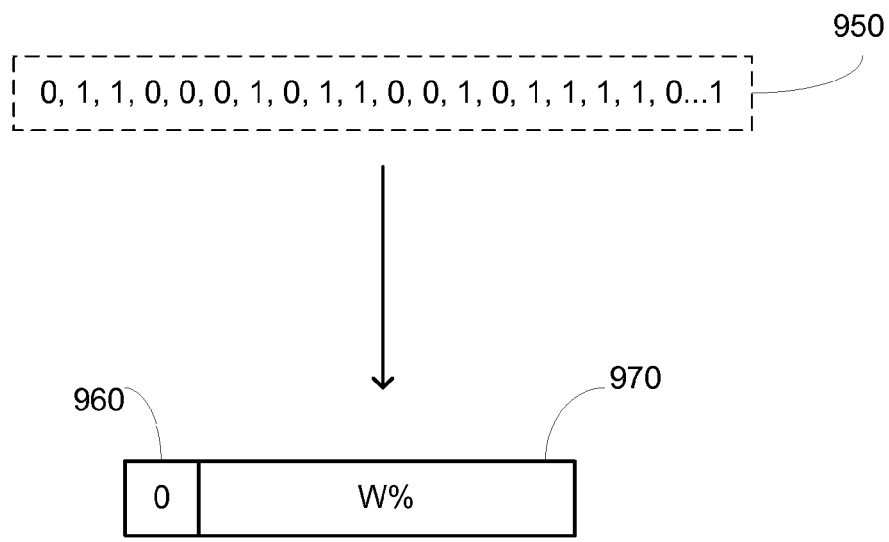
FIG. 9 illustrates hard information and soft information according to an embodiment of the invention.

FIG. 9 illustrates hard information and soft information according to an embodiment of the invention.

Hard information includes multiple read results 950 that are obtained from multiple N read attempts of a flash memory cell. As an example the ration between the "0" and "1" read results is Q %. The soft information may include (a) information representative of the content of the flash memory cell—a single hard information bit (zero or one) such as zero bit 960 and (b) reliability information 970 such as multiple bits indicating that the reliability of the single hard information bit is W %.

Any of the mentioned above methods can be executed by a processor that executes instructions stored in a computer program product that includes a computer readable medium that is non-transitory. For example, a non-transitory computer readable medium can be provided that stores instructions for performing multiple read attempts while using the hard information interface, of a plurality of flash memory cells to provide multiple read results; wherein each flash memory cell is read by providing a reference voltage to the flash memory cell; and generating, for each flash memory cell, reliability information based upon multiple read results of the flash memory cell.

Any of the mentioned above methods can be executed by a flash memory controller that may include: a read circuit arranged to perform multiple read attempts of a plurality of flash memory cells to receive from a hard interface multiple read results; wherein each flash memory cell is read by providing a reference voltage to the flash memory cell; and a reliability module arranged to generate, for each flash memory cell, reliability information based upon multiple read results of the flash memory cell.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for generating reliability information using a hard information interface, the method comprising:
performing multiple read attempts, while using the hard information interface, of a plurality of flash memory cells to provide multiple read results; wherein each flash memory cell is read by providing a reference voltage to the flash memory cell; wherein a same reference voltage is provided during the multiple read attempts; and
generating, for each flash memory cell, reliability information based upon multiple read results of the flash memory cell.

2. The method according to claim 1, comprising generating the reliability information of a flash memory cell based upon (a) a relationship between numbers of read result of different values of the flash memory cells, and (b) a first mapping between values of the relationship and reliability information values.

3. The method according to claim 2, wherein the generating of the reliability information is further responsive to a state of the multiple flash memory cells.

4. The method according to claim 1, comprising selecting a value of information representative of a content of a flash memory cell based upon (a) a relationship between numbers of read result of different values of the flash memory cells, and (b) a first mapping between values of the relationship and values of information representative of the content of the flash memory cell.

5. The method according to claim 4, comprising generating the reliability information of the flash memory cell based upon (a) the relationship between numbers of read result of different values of the flash memory cells, and (b) the first mapping between values of the relationship and reliability information values.

6. The method according to claim 1 comprising:
estimating, for each flash memory cell, a voltage difference between a threshold voltage of the flash memory cell and the reference voltage provided; and
wherein the generating, for each flash memory cell, the reliability information is responsive to the voltage difference of the flash memory cell.

7. The method according to claim 6, comprising using same read parameters during the multiple read attempts.

8. The method according to claim 6, wherein the estimating of the voltage difference of each flash memory cell is responsive to (a) relationship between numbers of read result of different values and (b) a second mapping between the relationship and the voltage difference.

9. The method according to claim 8, comprising estimating the second mapping based upon a state of the multiple flash memory cells.

10. The method according to claim 8, comprising estimating the second mapping based upon a wear level of the multiple flash memory cells.

11. The method according to claim 8, comprising estimating the second mapping based upon an evaluated retention of the multiple flash memory cells.

12. The method according to claim 6, comprising performing different types of read attempts that differ from each other by bit significance; wherein the estimating of the voltage difference of each flash memory cell is responsive to read results obtained during all of the types of the read attempts.

13. The method according to claim 6, comprising generating reliability information that is a log likelihood ratio (LLR).

14. The method according to claim 1, comprising supplying a supply voltage of different values to the multiple flash memory cells during different read attempts.

15. The method according to claim 14, comprising estimating, for each flash memory cell, a flipping supply voltage that causes a change in a value of a read result of the flash memory cell.

16. The method according to claim 15, wherein the estimating of the voltage difference of a flash memory cell comprises: calculating a supply voltage difference between the flipping supply voltage value and a reference value of the supply voltage; and estimating the voltage difference based upon the supply voltage difference and a third mapping between supply voltage difference values and voltage difference values.

17. The method according to claim 16, wherein the reference value is selected out of the different values of the supply voltage.

18. The method according to claim 15, comprising finding, for each of the different values of the supply voltages, a number of flipping flash memory cells; and selecting a reference value of the supply voltage based upon the numbers of flipping flash memory cells.

19. The method according to claim 18, comprising finding the reference voltage within a range of supply voltages that is exhibits a minimal change in a number of flipping flash memory cells.

20. The method according to claim 1, comprising performing the multiple read attempts without being aware of exact values of read thresholds utilized to read the multiple flash memory cells.

21. The method according to claim 1, comprising performing the multiple read attempts while being prevented from directly changing read thresholds utilized to read the multiple flash memory cells.

22. The method according to claim 1, comprising calculating a first mapping between values of the relationship and reliability information values by programming known information to a plurality of flash memory cells; reading the plurality of flash memory cells multiple times to provide test results and comparing the test results to the known information.

23. The method according to claim 1, comprising generating the reliability information of a flash memory cell based upon (a) a relationship between numbers of read result of different values of the flash memory cells, (b) and a mapping between the relationship and log likelihood ratio (LLR).

24. The method according to claim 23 comprising calculating the mapping between the relationship and the LLR by programming and reading known information.

25. The method according to claim 1, comprising selecting a value of information representative of a content of a flash memory cell based upon a relationship between numbers of read result of different values of the flash memory cells.

26. The method according to claim 25, comprising selecting a value of information representative of a content of a flash memory cell based upon (a) a ratio between numbers of read result of different values of the flash memory cells; and (b) mapping between values of the ratio and values of the information.

27. The method according to claim 1, comprising generating a value of information representative of a content of a flash memory cell by performing a logical operation on multiple read results of a same flash memory cell.

28. The method according to claim 1, comprising selecting a value of information representative of a certain bit of a content of a flash memory cell based upon a value of information representative of at least one more significant bit of the content of the flash memory cell.

29. The method according to claim 28, comprising:
selecting a selected logical operation to be applied on multiple read results of a same flash memory cell; and
applying the selected logical operation on the multiple read results to provide a value of information representative of the certain bit of the content of the flash memory cell;
wherein the selecting of the selected logical operation is responsive to the value of information representative of the at least one more significant bit of the content of the flash memory cell.

30. The method according to claim 28, comprising:
selecting a selected operand out of a "larger than" operand and a "smaller than" operand;
comparing between a ratio between numbers of read result of different values of the flash memory cells and a threshold using the selected operand to provide a value of information representative of a certain bit of a content of a flash memory cell;
wherein the selecting is responsive to the value of information representative of the at least one more significant bit of the content of the flash memory cell.

31. A non-transitory computer readable medium that stores instructions for: performing multiple read attempts while using the hard information interface, of a plurality of flash memory cells to provide multiple read results; wherein each flash memory cell is read by providing a reference voltage to the flash memory cell; wherein a same reference voltage is provided during the multiple read attempts; and generating, for each flash memory cell, reliability information based upon multiple read results of the flash memory cell.

32. A flash memory controller, comprising: (a) an interface arranged to send read commands to a flash memory device and to receive from a hard interface of a flash memory device read results indicative of a content of multiple flash memory cells of the flash memory device; wherein each flash memory cell is read by providing a reference voltage to the flash memory cell; wherein a same reference voltage is provided during the multiple read attempts; and (b) a reliability module arranged to generate, for each flash memory cell, reliability information based upon multiple read results of the flash memory cell.

* * * * *